United States Patent [19]

Nakamura

[11] Patent Number: 5,752,395
[45] Date of Patent: May 19, 1998

[54] GOLDEN ORNAMENT AND METHOD FOR PRODUCTION THEREOF

[75] Inventor: Yutaka Nakamura, Tokyo, Japan

[73] Assignee: Orient Watch Co., Tokyo, Japan

[21] Appl. No.: 599,967

[22] Filed: Feb. 14, 1996

[30] Foreign Application Priority Data

Feb. 17, 1995 [JP] Japan ................................ 7-053319

[51] Int. Cl.⁶ .................................................. A44C 15/00
[52] U.S. Cl. ......................................................... 63/34
[58] Field of Search ............................ 63/34; 428/671, 428/672

[56] References Cited

U.S. PATENT DOCUMENTS 5,510,012  4/1996  Schulz et al. ................ 204/192.12

FOREIGN PATENT DOCUMENTS

A-42 05 017  8/1993  Germany .
60046361  8/1983  Japan .
6049563  2/1994  Japan .
6057356  3/1994  Japan .
2138027  10/1984  United Kingdom .
2162864  2/1986  United Kingdom .

*Primary Examiner*—Kien T. Nguyen
*Attorney, Agent, or Firm*—Ronald R. Snider

[57] ABSTRACT

A golden ornament having formed on a substrate either golden coating incorporating gold, iron, and oxygen therein or a golden coating comprising gold, iron, and oxygen; a golden ornament having formed on a substrate an undercoating layer comprising a Ti compound or a Zr compound and further formed on the undercoating layer a golden coating comprising gold, iron, and oxygen; the golden coating having the magnitudes of color tones, $L^*$, $a^*$, and $b^*$, in the respective ranges, $90 \geq L^* \geq 75$, $10 \geq a^* \geq 0$, and $40 \geq b^* \geq 20$; and a method for the production of the golden ornament characterized by having the golden coating formed by the physical vapor deposition of gold and iron on the substrate or the undercoating layer in an ambient air containing oxygen.

6 Claims, 1 Drawing Sheet

GOLDEN ORNAMENT AND METHOD FOR PRODUCTION THEREOF

BACKGROUND OF THE INVENTION

1. Field of the Invention:

This invention relates to such golden ornaments as watch cases, watch bracelets, dials, eyeglass frames, and accessorial devices and a method for the production thereof.

2. Description of the Prior Art

In such ornaments as watch cases, watch bracelets, and eyeglass frames which have a golden coating deposited on the surface of a substrate, the golden parts thereof have been heretofore manufactured by forming on the surface of the substrate a coating of gold or a gold alloy. Since the color of pure gold has an excessively strong color of gold, the golden parts are demanded to be in a color of gold of light tone having particularly the yellowness thereof subdued. This demand has been heretofore met with gold-chromium a alloys and gold-nickel alloys, for example. These alloys, however, pose insufficient reddishness as a problem. As materials which are liberated from this problem, gold-chromium-copper alloys and gold-nickel-copper alloys which are tinted with yellow and red by the addition of copper have been known.

As means for producing the coating mentioned above, the vacuum deposition method, ion plating method, or sputtering method which resort to the phenomenon of vaporization have been known.

The gold-chromium-copper alloys and the gold-nickel-copper alloys, however, are at a disadvantage in offering no sufficient resistance to corrosion. In the formation of the coating of such alloy, the vacuum deposition method or the ion plating method entails a problem as to the stability of speed of vaporization. Since the component metals of the alloy have different vapor pressures, one of them is vaporized earlier than the others when they are vaporized from one and same vapor source. Even when separate vapor sources are used severally for the vaporization of the component metals, the speeds of vaporization permit no easy control because the component metals have different ranges in which their speeds of vaporization vary with changes in temperature and, therefore, demand use of a specific method set for the purpose of controlling the vaporization of each component metal. Thus, the alloys mentioned above raise various problems, such as allowing the formation of a coating by a process of vaporization to be controlled only with extreme difficulty and attaining the impartation of necessary quality to the produced coating with poor repeatability.

The sputtering method, when used in preparing relevant alloy components and consequently producing a color of gold, poses the problem of necessitating change of targets at the cost of much time and labor.

SUMMARY OF THE INVENTION

This invention has been produced with a view to overcoming the problems of the prior art mentioned above. The first object of this invention resides in providing a golden ornament tinted in red and abounding in resistance to corrosion.

The second object of this invention resides in providing a method for producing a reddish golden ornament easily with perfect repeatability.

The third object of this invention resides in enabling the reddishness of a golden ornament to be adjusted by a simple method.

BRIEF DESCRIPTION OF THE DRAWINGS

The invention will be better understood and objects, features, and characteristics thereof other than those set forth above will become apparent when consideration is given to the following detailed description thereof. Such description makes reference to the following annexed drawing.

DETAILED DESCRIPTION OF THE INVENTION

Figure 1:
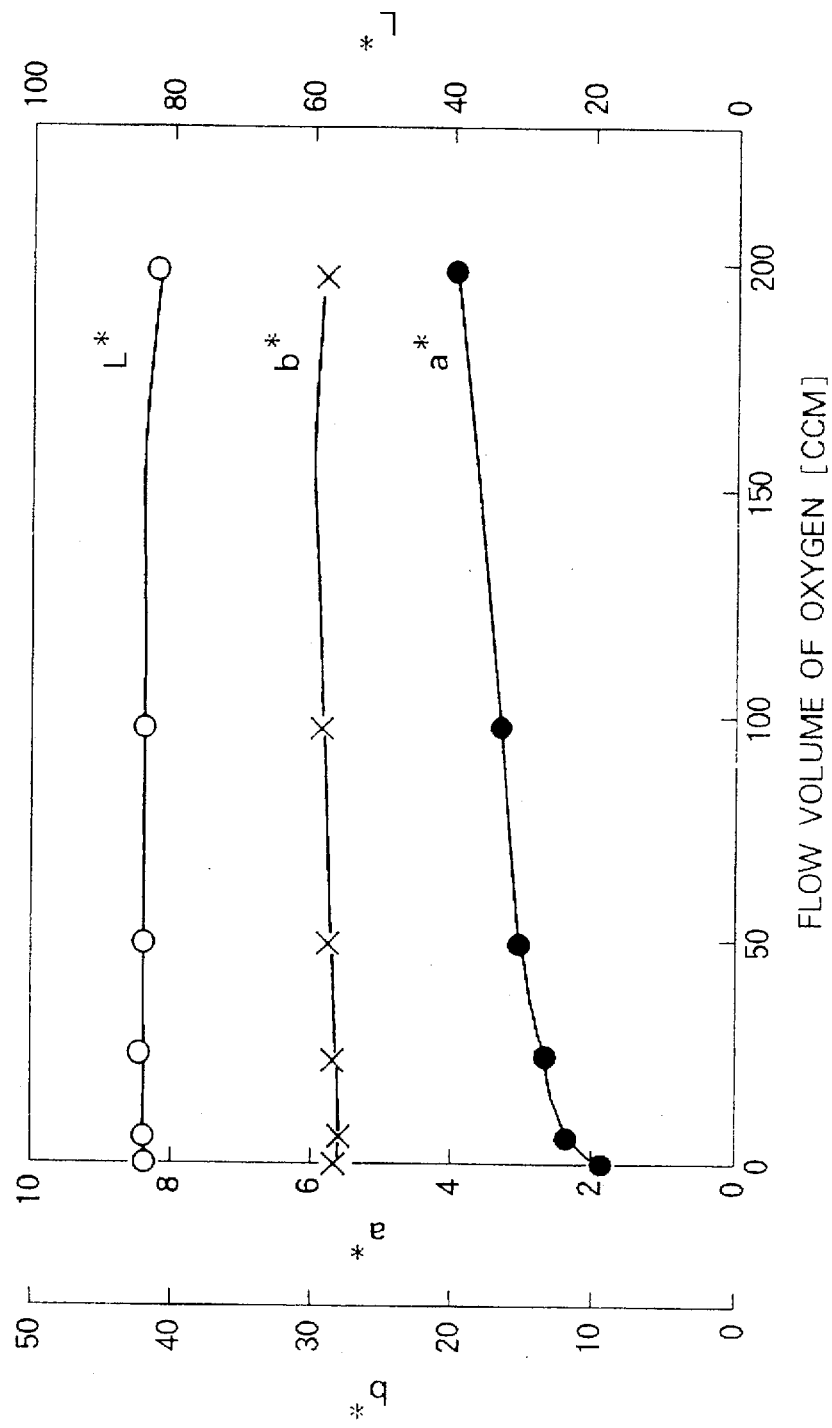
FIG. 1 is a graph showing the relation between the flow volume of oxygen and the color tone of a golden layer.

The inventor, after a series of diligent studies, has found that a golden ornament improved in resistance to corrosion and tinted in red is obtained in consequence of addition of iron and oxygen to gold. This invention has been perfected on the basis of this knowledge.

Specifically, the first aspect of this invention resides in a golden ornament which is characterized by having formed on a substrate a golden coating comprising gold, iron, and oxygen therein (containing at least these three component elements).

The second aspect of this invention resides in a golden ornament which is characterized by having formed on a substrate a golden coating consisting of gold, iron, and oxygen (containing substantially no other component element).

The thickness of the golden coating is generally in the range of 0.05 to 0.5 μm, preferably in the range of 0.1 to 0.3 μm. The surface of the golden ornament may be in mirror finish or stain finish.

The third aspect of this invention resides in a golden ornament which is characterized by having formed on a substrate an undercoating layer comprising a Ti compound or a Zr compound and having formed on the under-coating layer a golden coating consisting of gold, iron, and oxygen (containing substantially no other component element).

The fourth aspect of this invention resides in a golden ornament, wherein the Ti compound is TiN or TiCN and the Zr compound is ZrN or ZrCN.

The fifth aspect of this invention resides in a golden ornament, wherein the golden coating has the magnitudes of color tones, L*, a*, and b* determined by the L*, a*, b* display system (JIS [Japanese Industrial Standard] 28729-1980) in the respective ranges, $90 \geq L^* \geq 75$, $10 \geq a^* \geq 0$, and $40 \geq b^* \geq 20$.

The sixth aspect of this invention resides in a golden ornament which is characterized by having formed on a substrate a golden coating consisting of gold and iron.

The seventh aspect of this invention resides in a method for the production of the above golden ornament, wherein the color tone of the golden coating is adjusted by having the iron and gold contents of the golden coating set at suitable values.

The eighth aspect of this invention resides in a method for the production of the above golden ornament, wherein the golden coating is formed by the physical vapor deposition of gold and iron on the substrate or the undercoating layer in an ambient gas containing oxygen.

For the physical vapor deposition, the ion plating method, sputtering method, vacuum vapor deposition method, and the like are usable. Among the methods cited above, the ion plating method proves particularly advantageous.

The ninth aspect of this invention resides in a method for the production of a golden ornament, wherein the physical vapor deposition of gold and iron is accomplished by the use of one same vapor source.

The tenth aspect of this invention resides in a method for the production of a golden ornament, wherein the physical vapor deposition is carried out by continuing supply of oxygen into the ambient gas containing oxygen.

The eleventh aspect of this invention resides in a method for the production of a golden ornament, wherein the reddishness of the golden coating is adjusted by controlling the volume of supply (flow volume) of oxygen.

The twelfth aspect of this invention resides in a method for the production of a golden ornament, wherein the physical vapor deposition is carried out by the ion plating technique.

Though the cause of the reddish tint acquired by the golden ornaments of this invention has not yet been fully elucidated, it may be logically explained by a supposition that the iron component goes to decrease the yellowness of the gold component and, at the same time, the oxide of iron plays the role of tinting the ornament in red.

The golden coatings in the golden ornaments of this invention essentially contain gold, iron, and oxygen. The golden coating, however, may additionally contain other metal component than gold and iron. Appropriately, these golden coatings avoid containing copper because copper is a corrosive component.

Since the method for the production of a golden ornament of this invention produces a golden coating on a substrate or on an undercoating layer by physical vapor deposition of gold and iron in an ambient gas containing oxygen, it uses two separate vapor sources. Since iron and gold have relatively close vapor pressures, the method may use one same vapor source instead. The method gains in efficiency as the number of vapor sources decreases and this decrease brings about an addition to the ease of control and to the repeatability of vapor deposition.

Appropriately, the magnitudes of color tones of the golden coating, L*, a*, and b*, mentioned above fall in the respective ranges, $90 \geq L^* \geq 75$, $10 \geq a^* \geq 0$, and $40 \geq b^* \geq 20$. The magnitude, L*, has its upper limit set at 90, a value which substantially represents the brightness of pure gold. If this magnitude is less than 75, the golden coating will assume such darkness as deviates from the color tone proper for gold. If the magnitude, a*, approaches 0, the reddishness of the golden coating will proportionately dwindle. If it exceeds 10, however, the surface of the golden coating will be coarsened and deprived of good appearance. For the golden coatings in the golden ornaments of this invention, the magnitude, *b, has its upper limit set at 40, which value substantially represents the color of pure gold, because the golden coatings contain iron and an oxide of iron. If this magnitude, b*, is less than 20, the golden coatings will no longer show the color of gold.

Incidentally, the degree of reddishness of the golden coating can be adjusted by controlling the content of the oxygen component therein. The reddishness increases as the content of the oxygen component increases.

Now, this invention will be described more specifically below with reference to working examples.

Example 1

A glass substrate was set in place in a vacuum device and then heated therein at a fixed temperature of 250° C., with the interior of the vacuum device evacuated to $1 \times 10^{-4}$ torr in advance of the heating. Then, the glass substrate was subjected to ion bombardment with Ar gas to clean the surface thereof. Then, the Ar gas was introduced into the vacuum device up to $2 \times 10^{-4}$ torr and oxygen as a reaction gas was introduced therein at a fixed flow volume and a resistance heating boat carrying 5 g of gold and 0.1 g of iron thereon was heated to effect ion plating of the glass substrate and consequent deposition of a golden layer 0.1 µm in thickness on the glass substrate. This golden layer (golden coating) was tested for color tone and film composition.

When the flow volume of oxygen was set at 2 SCCM, the coating was found to have color tones of the magnitudes, L*=82.93, a*=4.75, and *b=29.51, and a composition of 72.6 at % of gold, 10.4 at % of iron, and 17.0 at % of oxygen.

When the flow volume of oxygen was set at 8 SCCM, the coating was found to have color tones of the magnitudes, L*=77.12, a*=8.45, and *b=26.26, and a composition of 65.0 at % of gold, 9.5 at % of iron, and 25.5 at % of oxygen.

Incidentally, a film of pure gold produced in the same manner as above was found to have color tones of the magnitudes, L*=91.27, a*=1.55, and b*=39.41.

The magnitudes, L*, a*, and b*, mentioned above were those of reflectance determined by the integrating-sphere method with a light source of D65 and a field of view of 2°.

Example 2

A watch bracelet made of stainless steel and coated with a TiN film was set in place in a vapor deposition device different from the vacuum device of Example 1 and then heated therein at a fixed temperature of 250° C., with the interior of the device evacuated meanwhile to $3 \times 10^{-5}$ torr. It was subjected to ion bombardment with Ar gas to clean the surface thereof. Then, the Ar gas was introduced into the vapor deposition device up to $3 \times 10^{-4}$ torr and oxygen as a reaction gas was introduced therein at a flow volume of 150 SCCM and a resistance heating boat carrying 10.0 g of gold and 0.2 g of iron thereon was heated to effect ion plating of the coated watch bracelet and consequent deposition of a golden layer 0.1 µm in thickness on the watch bracelet.

Separately, a watch bracelet made of stainless steel and coated with a TiN film was similarly placed in an evacuated vapor deposition device and subjected to ion bombardment with hot Ar gas. In the device having the watch bracelet enclosed with an ambience of $3 \times 10^{-4}$ torr of Ar gas, a resistance heating boat carrying 10.0 g of gold and 0.2 g of iron thereon and another resistance heating boat carrying 5.0 g of copper thereon were heated to effect vapor deposition of the metals at an adjusted rate and consequent formation of a golden layer 0.1 µm in thickness on the watch bracelet.

The film formed of gold, iron, and oxygen and the film formed of gold, iron, and copper obtained as described above were heated in an open air at 200° C. for 120 minutes. At the end of the heating, they were tested for color tone. The results are shown in Table 1.

TABLE 1

|  | Film of gold, iron, and oxygen | | | Film of gold, iron, and copper | | |
| --- | --- | --- | --- | --- | --- | --- |
|  | L* | a* | b* | L* | a* | b* |
| Before heating | 86.82 | 3.94 | 29.63 | 89.96 | 4.72 | 27.61 |
| After heating | 84.69 | 3.82 | 29.30 | 71.36 | 22.16 | 41.54 |

It is clearly noted from Table 1 that the film of gold, iron, and copper showed large changes of color tones and the film of gold, iron, and oxygen heated under the same conditions showed no notable change in color tones. When these films were left standing for 24 hours on a paper towel impregnated with a man-made perspiration solution composed of 20 g of sodium chloride, 2 g of urea, and 2 g of lactic acid per liter, the film of gold, iron, and copper was found to have formed rust and the film of gold, iron, and oxygen was found to have formed no rust on the surface.

Example 3

Films of gold, iron, and oxygen were formed by following the procedure of Example 2 while varying the flow volume of oxygen from 0 SCCM to 192 SCCM. The produced golden films were tested for color tone. The results are shown in FIG. 1.

It is clearly found from the diagram that the magnitudes of a* or the degrees of reddishness of these films increased with the increasing flow volumes of oxygen. When the formation of a film was repeated at a fixed flow volume of oxygen of 48 SCCM, the film acquired color tones of perfect repeatability in the successive cycles as shown in Table 2.

TABLE 2

|  | L* | a* | b* |
|---|---|---|---|
| First cycle | 83.82 | 3.07 | 28.28 |
| Second cycle | 83.62 | 3.10 | 29.00 |
| Third cycle | 83.17 | 3.33 | 29.23 |
| Fourth cycle | 84.09 | 3.01 | 29.42 |
| Fifth cycle | 83.18 | 3.04 | 19.11 |

Example 4

Films of gold, iron, and oxygen were formed by following the procedure of Example 2 while fixing the flow volume of oxygen at 48 SCCM and using a resistance heating boat carrying 10.0 g of gold and 0.1 g of iron and another resistance heating boat carrying 10.0 g of gold and 0.2 g of iron, to produce golden layers. These golden layers were tested for color tone. The results are shown in Table 3.

TABLE 3

| Gold 10.0 g + iron 0.1 g | | | Gold 10.0 g + iron 0.2 g | | |
|---|---|---|---|---|---|
| L* | a* | b* | L* | a* | b* |
| 88.79 | 3.09 | 35.49 | 83.92 | 3.07 | 28.28 |

It is clearly noted from Table 3 that the magnitude of b* or the tint of yellow in the golden layer could be easily varied without affecting the tint of red by varying the ratios of gold and iron carried on the resistance heating boat.

It is clear from the description given above that the golden ornament of the second aspect of this invention and the golden ornament of the third aspect of this invention assume a tint of red because the former has formed on a substrate a golden film comprising gold, iron, and oxygen and the latter has formed on a substrate an undercoating layer and then on this undercoating layer a golden coating comprising gold, iron, and oxygen. The golden ornaments of the above two inventions enjoy perfect resistance to corrosion because their golden coatings avoid containing copper, a corrosive substance, as a component metal of coating.

The golden ornament of the first aspect of this invention (similarly to the golden ornaments of the second and the third aspect of this invention) offers perfect resistance to corrosion and assumes a tint of red because the golden coating thereof avoids containing copper as a component metal.

The golden ornaments of the third and the fourth aspect of this invention don't lose the color tone of gold even after the metal layer has been worn off because it has formed on a substrate an undercoating layer formed of a Ti compound (TiN or TiCN) or a Zr compound (ZrN or ZrCN) which assumes the color of gold and excels in resistance to corrosion and resistance to abrasion, The golden ornament of the sixth aspect of this invention assumes a color of subdued yellow because it has formed on a substrate a golden coating comprising gold and iron.

The method for the production of a golden ornament of the eighth aspect of this invention permits the golden ornament to be produced as tinted in red easily with perfect repeatability because the golden coating thereof is formed on a substrate or on an undercoating layer by physical vapor deposition of gold and iron in an ambient gas containing oxygen.

Then, in the method for the production of a golden ornament of the eleventh aspect of this invention, the tint of red of the golden coating can be easily adjusted by controlling the amount of supply (flow volume) of oxygen.

By the method for the production of a golden ornament of the twelfth aspect of this invention, the golden coating to be formed on the golden ornament exhibits excellent adhesiveness to the substrate because the physical vapor deposition of metal components is carried out by the ion plating technique.

While there have been shown and described preferred embodiments of the invention, it is to be clearly understood that the invention is not limited thereto but may be otherwise variously embodied and practiced within the scope of the following claims.

What is claimed is:

1. A golden ornament characterized by having formed on a substrate a golden coating consisting of gold, iron, and oxygen.

2. A golden ornament characterized by having formed on a substrate an undercoating layer comprising a Ti compound or a Zr compound and having formed on said undercoating layer a golden coating consisting of gold, iron, and oxygen; and wherein said Ti compound consists of TiN and said Zr compound consists of ZrCN.

3. A golden ornament characterized by having formed on a substrate a golden coating comprising gold, iron, and oxygen therein;

wherein said golden coating has the magnitudes of color tones, L*, a*, and b* determined by the L*, a*, b* display system (JIS Z8729-1980) in the respective ranges, $90 \geq L^* \geq 75$, $10 \geq a^* \geq 0$, and $40 \geq b^* \geq 20$.

4. A golden ornament characterized by having formed on a substrate a golden coating consisting of gold, iron, and oxygen; and wherein said golden coating has the magnitudes of color tones, L*, a*, and b* determined by the L*, a*, b* display system (JIS Z8729-1980) in the respective ranges, $90 \geq L^* \geq 75$, $10 \geq a^* \geq 0$, and $40 \geq b^* \geq 20$.

5. A golden ornament characterized by having formed on a substrate an undercoating layer comprising a Ti compound or a Zr compound and having formed on said undercoating layer a golden coating consisting of gold, iron, and oxygen; and wherein said golden coating has the magnitudes of color tones, L*, a*, and b* determined by the L*, a*, b* display system (JIS Z8729-1980) in the respective ranges, $90 \geq L^* \geq 75$, $10 \geq a^* \geq 0$, and $40 \geq b^* \geq 20$.

6. The golden ornament according to claim 5, wherein said Ti compound is TiN or TiCN and said Zr compound is ZrN or ZrCN.

* * * * *